(12) United States Patent
Jung et al.

(10) Patent No.: US 7,022,917 B2
(45) Date of Patent: Apr. 4, 2006

(54) CONSTRUCTION AND ELECTRICAL CONNECTION TECHNIQUE IN TEXTILE STRUCTURES

(75) Inventors: Stefan Jung, Munich (DE); Christl Lauterbach, Hohenkirchen-Siegertsbrunn (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/868,501

(22) Filed: Jun. 14, 2004

(65) Prior Publication Data

US 2004/0259391 A1  Dec. 23, 2004

Related U.S. Application Data

(63) Continuation of application No. PCT/EP02/13745, filed on Dec. 4, 2002.

(30) Foreign Application Priority Data

Dec. 14, 2001 (DE) ............................ 101 61 527

(51) Int. Cl.
*H01R 4/02* (2006.01)
(52) U.S. Cl. .................. 174/88 R; 174/94 R
(58) Field of Classification Search ............ 174/117 F, 174/117 M, 94 R, 88 R; 439/876, 497, 37, 439/77, 67, 874; 361/807, 809; 29/843, 29/860, 854, 868, 869, 872
See application file for complete search history.

(56) References Cited

U.S. PATENT DOCUMENTS

| | | | |
|---|---|---|---|
| 3,160,790 A | | 12/1964 | Mittler |
| 3,277,347 A | | 10/1966 | Ecker |
| 3,479,565 A | | 11/1969 | Ross |
| 3,631,298 A | * | 12/1971 | Davis ........................ 361/809 |
| 4,255,853 A | * | 3/1981 | Campillo et al. ............. 29/843 |
| 4,517,739 A | * | 5/1985 | Lenaerts et al. ............. 29/846 |
| 4,639,054 A | * | 1/1987 | Kersbergen .................. 439/59 |
| 4,682,828 A | * | 7/1987 | Piper et al. ................... 439/92 |
| 4,958,260 A | * | 9/1990 | Kobayashi et al. ......... 361/749 |
| 5,089,669 A | | 2/1992 | Piper et al. |
| 5,480,325 A | * | 1/1996 | Tran et al. .................. 439/578 |
| 5,900,587 A | * | 5/1999 | Piper et al. ............. 174/117 F |
| 6,797,881 B1 | * | 9/2004 | Nakamura ................ 174/52.2 |
| 2004/0244193 A1 | * | 12/2004 | Jung et al. .................... 29/854 |

FOREIGN PATENT DOCUMENTS

| | | |
|---|---|---|
| CH | 682964 A5 | 12/1993 |
| DE | 31 16 348 A1 | 9/1982 |

(Continued)

OTHER PUBLICATIONS

Patent Abstracts of Japan; vol. 1996, No. 08, Aug. 30, 1996 & JP 08 106939 (Fuji Kobunshi Kogyo KK), Apr. 23, 1996, abstract.

*Primary Examiner*—Neil Abrams
(74) *Attorney, Agent, or Firm*—Darby & Darby

(57) ABSTRACT

Method for electrically connecting an electrical conductor to an electronic component including the steps of providing a textile material in which at least one flexible, wire-like and/or thread-like electrical conductor is arranged, providing the electrical conductor relative to an electrically conductive contact point of the electronic component, and electrically connecting the conductor to the contact point comprising the steps of electrically connecting an at least partly electrically conductive auxiliary contact to the conductor, and electrically connecting the auxiliary contact to the contact point, wherein the auxiliary contact is a metal lamina. In one embodiment, the auxiliary contact and the conductor may be joined to one another as they are joined to the contact point.

7 Claims, 8 Drawing Sheets

FOREIGN PATENT DOCUMENTS

| | | |
|---|---|---|
| DE | 33 32 536 A1 | 3/1985 |
| DE | 197 55 792 A1 | 6/1999 |
| DE | 100 49 397 A1 | 10/2001 |
| GB | 2 148 058 A1 | 5/1985 |
| WO | WO-86/02204 A1 | 4/1986 |
| WO | WO-02/095839 A2 | 11/2002 |

* cited by examiner

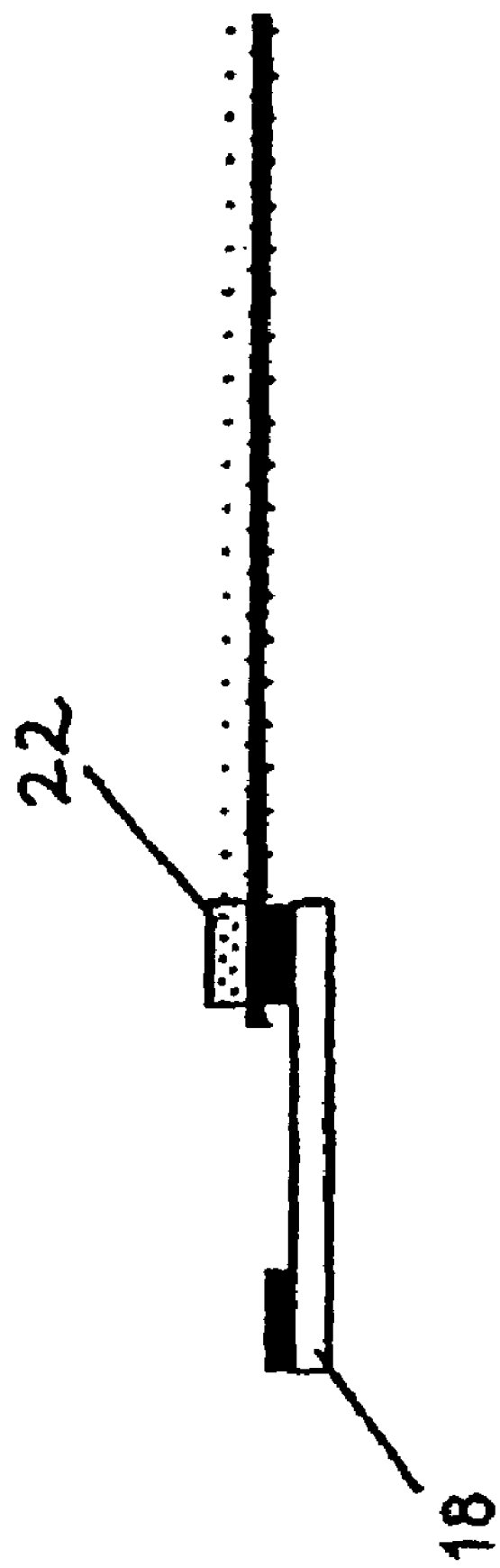

CONSTRUCTION AND ELECTRICAL CONNECTION TECHNIQUE IN TEXTILE STRUCTURES

CROSS-REFERENCE TO RELATED APPLICATION

This application is a continuation of International Patent Application Serial No. PCT/EP02/13745, filed Dec. 4, 2002, which published in German on Jun. 26, 2003 as WO 03/052875, and is incorporated herein by reference in its entirety.

FIELD OF THE INVENTION

The invention relates to a method for electrically connecting an electrical conductor to an electronic component and to a device.

BACKGROUND OF THE INVENTION

The integration of electronic components in a textile environment requires a special construction and connection technique which permits a reliable electrical connection of conventional electronic assemblies, for example integrated circuits, circuit boards or modules to a textile structure. Requirements made of such a construction and connection technique, in particular in respect of the mechanical, thermal and chemical loading occurring when the textile material is used in clothing, must satisfy accurately fitting positioning and processing even across seams in the textile material and also electrical insulation properties possibly required. It must likewise be taken into consideration that, at approximately 100 μm, the size of and distance between the contact points on typical electronic components are generally smaller than the period occurring on the textile side. Industrial scale manufacturing methods are unknown to date in the entire field of "wearable electronics".

SUMMARY OF THE INVENTION

It is therefore an object of the invention to propose a method for electrically connecting a textile structure to an electronic component which enables a mechanically, chemically and thermally loadable electrical connection and can be incorporated into an industrial scale manufacturing process. Furthermore, it is an object of the invention to specify a corresponding device.

According to the invention, a method for electrically connecting an electrical conductor to an electronic component comprises the following steps:
provision of a textile material in which at least one flexible, wire- and/or thread-like electrical conductor is arranged;
positioning of the electrical conductor of the textile material relative to an electrically conductive contact point of an electronic component; and
electrical connection of the conductor to the contact point.

The step of positioning of the electrical conductor arranged in the textile material relative to the electrically conductive contact point comprises, in particular, bringing the electrical conductor close and placing it preferably in contact with or direct proximity to the contact point. The electronic component may be for example an integrated circuit (chip) or a conductor track which is applied on an insulator and is connected to an external electronic component.

Preferably, the textile material is a fabric and the conductor comprises at least one weft and/or warp thread of the fabric. In this case, a fabric is understood to be a textile areal structure comprising two thread systems which cross one another in particular at right angles and are referred to—as usual—as warp and weft. The warp lies in the longitudinal direction of the weaving process, while the weft direction runs transversely with respect to the weaving direction. The conductor may be synthetic threads with conductive fine metal wires spun therein. As an alternative, the conductor may also comprise a thin metal wire, for example a fine silver or copper wire, which forms a weft or warp thread of the fabric. Preferably, the conductor does not comprise a single weft or warp thread, but rather a multiplicity of weft or warp threads arranged adjacent, in particular, in the fabric. An electrical interruption of a fine metal wire in one of the threads does not then lead to an interruption of the electrical conductivity of the conductor, thus resulting in a redundant arrangement having higher reliability. In order to ensure a better electrical connection of the conductor to the contact point, it may be advantageous to remove weft or warp threads which adjoin the conductor in the region of the conduct-making zone prior to the electrical connection of the conductor to the contact point.

Preferably, the conductor has an electrical insulation and the step of connection of the conductor to the contact point comprises the at least partial chemical and/or thermal removal of the insulation. In a textile structure with groups of threads which are alternately electrically conductive and insulating, said groups running parallel, the fine metal wires embedded in the conductive yarns are preferably provided with a protective layer for electrical insulation in order, in particular in the event of folding or lateral compression of the fabric, to prevent a direct electrical contact between threads of different conductors—and thus electrical short circuits. When using non-insulated wires, creepage currents or short circuits could also occur, for example if moisture permeates the fabric, and, consequently, current paths could also form between conductor threads that are far away from one another. This holds true particularly when groups of conductive threads run perpendicularly to one another in the textile structure (electrically conductive weft and warp threads) and thus have crossover points.

The protective layer for electrically insulating the fine metal wires must in the first instance be robust such that it is not damaged both during the production of the thread (spinning process, etc) and during the process for producing the fabric (weaving, sewing and knitting process, etc) and, particularly if the textile structure is used in ready-made clothing, also withstands mechanical, thermal and chemical loading that may occur. Prior to the electrical connection of the conductor to the contact point or during this step, this electrical insulation must be removed in order that a reliable electrical contact can be produced between the conductor and the contact point. As an alternative, a textile material which has an initially non-insulated conductor may be provided. After the electrical connection of the electrically non-insulated conductor to the contact point, an electrical insulation, which protects the conductor from unintentional electrical short circuits, may be introduced in a subsequent process step for example by means of an impregnating step or by means of electrodeposition of insulating material (e.g. polymers) on the metallic conductor.

Preferably, the step of electrical connection of the conductor to the contact point comprises the application of a solder agent to at least one region of the contact point and the mechanical pressing of the conductor onto the contact point provided with solder agent. It has surprisingly been ascertained that simply heating the contact point which is provided with solder agent and at which the conductor that is to be electrically connected is arranged leads to satisfactory electrical connection results only to a limited extent. However, the electrical connection can be considerably improved by virtue of the fact that the step of electrical connection of the conductor to the contact point comprises the step of mechanical pressing of the conductor onto the contact point provided with solder agent. By way of example, if the conductor comprises synthetic fibers with an electrically insulated metal wire spun in, then the improvement in the electrical connection properties that is attributable to the mechanical pressing-on is attributable through a process of mechanical displacement of the thermally decomposed insulating sheath, which process enables the solder agent to come into contact with a larger surface of the metal wire. In comparison with connection methods in which only the solder agent is melted in a "static" state, such a "dynamic" mechanical pressing-on method achieves better electrical connection results.

Preferably, the conductor is pressed on by means of a soldering device. The soldering device may be for example the tip of an industrial solder apparatus which supplies heat and possibly additional solder agent.

As an alternative, it may be provided that the contact point is coated at least in regions with a conductive adhesive preferably having chemical constituents that destroy a possible insulating sheath of the at least one fine metal wire of the conductor. In this case, too, the mechanical pressing-on step improves the electrical contact between conductor and contact point.

In accordance with a preferred embodiment of the invention, the component comprises a multiplicity of electrically conductive contact points, the textile material comprises a multiplicity of electrical conductors, and the positioning step comprises the simultaneous arrangement of the conductors at the contact points. This connection method, which is particularly suitable for industrial mass production, is based on a process of simultaneously electrically connecting a multiplicity of electrical conductors to a multiplicity of corresponding contact points. The conductors may for example in each case comprise at least one weft or warp thread of a textile fabric. This predetermined conductor arrangement may be positioned relative to a correspondingly arranged multiplicity of electrically conductor contact points and be arranged onto the latter without the need for manual and sequential handling of the individual conductors and contact points.

In accordance with a particularly preferred embodiment of the invention, the step of electrical connection of the conductor to the contact point comprises the electrical connection of an at least partly electrically conductive auxiliary contact to the conductor and the electrical connection of the auxiliary contact to the contact point. Consequently, the electrical connection between the conductor and the contact point is effected by means of an additional (auxiliary) component which, in a first step, is fixed at the textile material and electrically connected to the conductor.

Preferably, the step of electrical connection of the auxiliary contact to the conductor comprises
the application of a solder agent to at least one region of the auxiliary contact,
the arrangement of the solder-coated region of the auxiliary contact onto the conductor and
the heating of the auxiliary contact above the melting point of the solder agent in order to electrically connect the auxiliary contact to the conductor.

The electrical connection of the conductor to the contact point is thus effected in two steps. Firstly, the electrical conductor is electrically connected to the solder-coated auxiliary contact by the conductor being positioned relative to the solder-coated region of the auxiliary contact and pressed on with sufficient action of heat. It is particularly advantageous to press the solder-coated auxiliary contact onto the conductor arranged in the textile material for example by means of a soldering device, the solder-coated region of the auxiliary contact facing the conductor and the soldering device exerting a mechanical pressure on that side of the auxiliary contact which is opposite to the solder-coated region.

Particular advantages arise if the textile material is a synthetic fiber fabric with electrical conductors introduced. In this case, the auxiliary contact is preferably heated in such a way that the synthetic fiber fabric melts in the region where the auxiliary contact bears on the textile material, and thus bonds intimately with the auxiliary contact. This results in a mechanically resistant assemblage between the auxiliary contact and the textile material which, in particular, can withstand the mechanical loading of the kind that may occur in items of clothing. At the textile material prepared in this way with a fitted auxiliary contact, an electrical connection to the contact point of the electronic component can subsequently be produced by means of soldering and/or adhesive bonding methods. The auxiliary contact may be arranged directly onto the contact point of the component. As an alternative, such an arrangement may be chosen in which the contact point comes into contact with that side of the textile material which is opposite to the side on which the auxiliary contact was fitted.

Furthermore, the step of electrical connection of the auxiliary contact to the conductor may comprise
the application of a conductive adhesive to at least one region of the auxiliary contact and
the arrangement of the conductive-adhesive-coated region of the auxiliary contact onto the conductor.

Preferably, the conductive adhesive used contains chemical constituents which destroy a possibly present insulating sheath of the fine metal wires of the conductor, in order thus to ensure improved electrical contact between the auxiliary contact and the conductor. The conductive adhesive should furthermore be selected such that it enables a secure connection that withstands the mechanical, chemical and thermal loading between the auxiliary contact and the textile material. In order to further improve the electrical contact between the auxiliary contact and the conductor, it may furthermore be provided that, in an upstream method step, firstly a possibly present insulation of the conductor is thermally and/or chemically removed in the region of the auxiliary contact to be connected.

Preferably, the auxiliary contact is a metal lamina which may comprise silver or copper, for example. Typical area dimensions of such a metal lamina correspond to the typical number of conductive yarns that run parallel multiplied by the typical yarn diameter plus an adjustment addition on account of adjustment inaccuracies. By way of example, if an electrical conductor is formed by four yarns each having a diameter of 500 µm, then the minimum area A is preferably $A=(4\times500 \ \mu m)^2=4 \ mm^2$. A round or rounded metal lamina is particularly preferably used. The thickness of the metal lamina is preferably chosen to be between 50 µm and 500 µm, particularly preferably 100 µm to 200 µm.

The electronic component is preferably a flexible strip, i.e. a flexible printed circuit board which comprises for example polyethylene (PE) with conductor tracks (for example copper tracks) applied thereto. Such a flexible strip advantageously permits adaptation of the distances between the electrical connecting points between the electronic component and the textile material, so that the flexible strip functions as an "adapter piece". Particular advantages arise if the textile material chosen is a synthetic fiber fabric which is coordinated with the material of the flexible strip in such a way that a seamless and stable transition is achieved by fusion or adhesive bonding or similar connection techniques.

In accordance with a further embodiment, the step of electrical connection of the conductor to the contact point comprises the electrical connection of the conductor to a further conductor arranged in the textile material. By way of example, it may be necessary for conductors that cross each other in the fabric (e.g. mutually crossing electrically conductive weft and warp threads) to be electrically connected. In this case, the electronic component is merely an auxiliary element which ensures a reliable electrical connection between the two conductors arranged in the textile material.

Preferably, the step of electrical connection of the conductor to the contact point comprises the following steps:
  positioning of the contact point of the component onto at least two conductors arranged in the textile material;
  fixing of the component at the textile material; and
  soldering or conductive adhesive bonding of the contact point to the conductors.

The component may be fastened to the textile material for example by means of a welding process or by means of an adhesive bonding step.

Preferably, the method comprises the further steps of positioning of an insulating film onto that side of the textile material which is opposite to the component for the insulation of the contact point, and fixing of the insulating film onto the textile material. This produces a "sandwich-like" construction in which the textile material is arranged between the component and the insulating film. The insulating film increases the mechanical stability of the construction and provides for a reliable electrical insulation of the electrically connected conductors. As an alternative to the insulating film used, which may be a thin plastic film, the contact point may be electrically insulated by application of an insulating coating or an impregnation.

According to the invention, a device comprises
  a textile material in which at least one flexible, wire- and/or thread-like electrical conductor is arranged;
  at least one electronic component having an electrically conductive contact point,
  the conductor being electrically conductively connected to the contact point.

The textile material is preferably a fabric and the conductor comprises at least one weft and/or warp thread of the fabric. Particularly preferably, the conductor is electrically connected to the contact point via at least one partly conductive auxiliary contact. The auxiliary contact is preferably a metal lamina which, in particular, may comprise copper or silver.

In accordance with a further preferred embodiment, the textile material comprises at least one adjusting device for positional adjustment of the conductor relative to the contact point. Such an adjusting device may comprise for example an adjusting loop and/or mark woven into the textile material. Marks may be produced for example by weaving in an adjusting pattern or a depression or by means of different coloration of the conductive and nonconductive fibers. Preferably, such coloration of the fibers is designed such that it can be washed out or removed, so that such an adjusting mark is merely used as an adjusting aid during construction and is removed for example during the first cleaning or washing of the textile material. Such adjusting devices introduced in the textile material can significantly simplify adjusting and handling problems associated with the textile material relative to the electronic component. Furthermore, adjusting devices are also advantageous when an electrical connection is intended to be effected over a relatively large distance or over a seam in the textile material, for example an item of clothing, and an automatic placement machine has to follow the course of the "correct" fabric fiber.

In accordance with a further preferred embodiment, the textile material has at least one woven-in component pocket designed for receiving the electronic component. By way of example, by means of the so-called Jaquard technique, the conductive warp threads can be permanently raised in a region of the textile material during the weaving process, so that they run loosely above the fabric structure in said region. An electronic component can be pushed into this pocket structure to be formed in this way and can possibly additionally be fixed by means of an adhesive bonding method. The freely running conductive fibers are preferably under a certain tensile stress and run tautly over the component, which is thus securely fixed in the component pocket.

BRIEF DESCRIPTION OF THE DRAWINGS

The invention is described by way of example below with reference to the drawings of preferred embodiments, in which:

FIGS. 2(a) through 2(e) show diagrammatic sectional view in plan view and section of a further embodiment of the invention, an auxiliary contact being used for making electrical contact;

DETAILED DESCRIPTION OF THE PREFERRED MODE OF THE INVENTION

Figure 1:
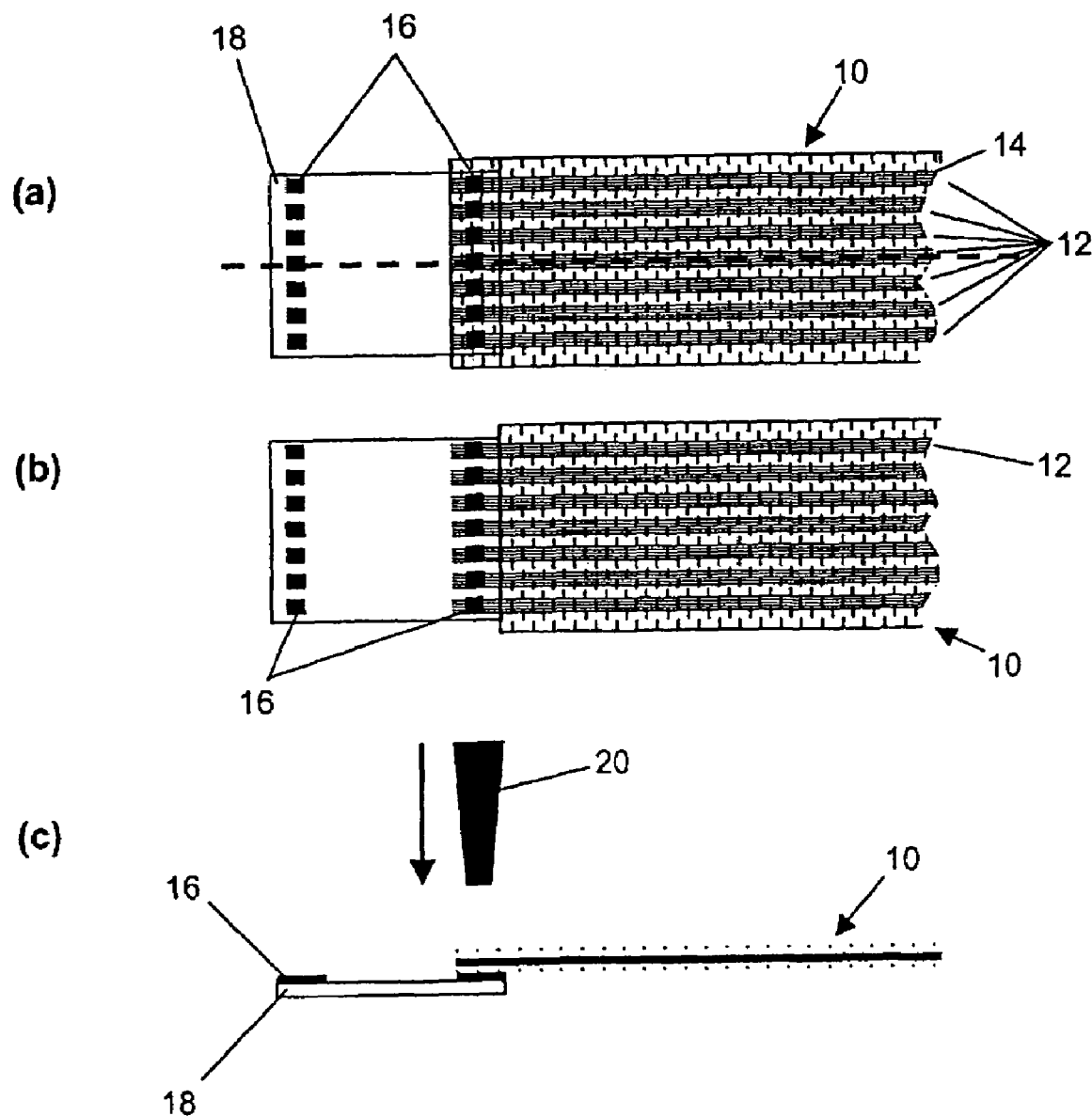
FIGS. 1(a) through 1(c) show diagrammatic views in plan view and section of one embodiment of the invention, in which a multiplicity of conductors arranged in a textile material are connected to an electronic component by means of a soldering step.

FIG. 1 diagrammatically illustrates a first embodiment of a device according to the invention. Reference symbol 10 designates a textile material, which is a fabric. In this case, fabric is understood to mean a textile areal structure comprising two thread systems which cross one another in particular at right angles and are referred to—as usual—as warp and weft. The warp lies in the longitudinal direction of the weaving process and is illustrated horizontally in FIGS. 1(a) and (b). The weft direction runs transversely with respect to the weaving direction. The weft threads are indicated diagrammatically by vertically running, broken lines in FIGS. 1(a) and (b).

A multiplicity of electrical conductors 12 are woven in the textile material 10. As is illustrated in FIGS. 1(a) and (b), each of the conductors 12 comprises a multiplicity of electrically conductive warp threads 14. The electrically conductive warp threads 14, which are highlighted as horizontally running lines in FIGS. 1(a) and (b), are preferably synthetic fibers into which a thin metal wire has been spun. Since each electrical conductor 12 is constructed from a multiplicity of electrically conductive warp threads 14, an electrical interruption of an individual warp thread 14 does not lead to an electrical interruption of the conductor 12. The warp threads 14 may also be thin metal wires, in particular copper wires, which, in particular, are spun with synthetic fibers to form a yarn. The spun-in thin metal wire preferably has an electrical insulating sheath.

In order to electrically connect the conductors 12 arranged in the textile material 10 to correspondingly arranged contact points 16 as an electronic component 18, in a first positioning step firstly the contact points 16 are positioned relative to the conductor 12. This comprises, in particular, bringing the textile fabric 10 close to the electronic components 18 in such a way that the conductors 12 bear as far as possible directly on the contact points 15. In order to facilitate this process of positioning or adjusting the textile material 10 with respect to the component 18, adjusting devices (not illustrated) may be provided in the textile material 10.

In order to improve the electrical contact between the conductors 12 and the contact points 16, the (non conductive) weft threads have been removed in the region of the contact points 16 in the embodiment shown in FIG. 1(b). Consequently, less insulating material, which may comprise synthetic fibers, for example, has to be displaced during the electrical connection process, thus resulting in a better electrical connection. The contact points 16 of the electronic component 18 are preferably provided with a solder agent. The electrical insulation of the fine metal wires in the electrically conductive warp threads 14 preferably comprises a material whose melting point is less than or equal to that of the electrically insulating fibers and that of the solder agent.

FIG. 1(c) illustrates a sectional view of the broken line of FIG. 1(a). The conductors 12 of the textile material 10, which bear on the assigned contact points 16 after the positioning process, are mechanically pressed onto the corresponding contact points 16 and simultaneously heated by means of a soldering device 20. The supply of heat destroys a possibly present electrical insulation of the fine metal wires of the electrically conductive warp threads 14, thus resulting in an electrical connection between the contact points 15 and the conductors 12. If the textile material 10 comprises synthetic fibers and the component 18 is chosen from a suitable material, an intimate, mechanically loadable composite comprising the melted synthetic fibers and the components 18 is produced.

The step of pressing the conductors 12 onto the contact points 16 must be performed in such a way that the melted insulation of the electrically conductive warp threads 14 and also the electrically insulating weft material present in FIG. 1(a) are displaced. As an alternative or optionally, an electrical insulation that is possibly present may also be removed beforehand for example by heating with a laser or by means of chemical substances. A further possibility consists in introducing the copper wires spun into the electrically conductive warp threads 14 first of all without an insulation layer, carrying out the desired electrical contact-connections of the conductors 12 to the contact points 16 and then finally electrically insulating the entire textile structure 10 in an impregnating or insulating or electroplating step (e.g. with a polymer). Such a subsequent insulation is also advantageous in other cases after mounting has been effected, in order that the locations of the wires which were stripped of insulation in a targeted manner for the electrical contact-connection are insulated from one another again.

FIG. 2 illustrates a further particularly preferred embodiment of a device according to the invention. This embodiment makes use of an auxiliary contact 22, which is fixed at the textile material 10 before the "actual" electrical contact-connection of the conductor 12 to the contact points 16 of the electronic component 18. The method for electrically connecting the conductors 12 to assigned contact points 16 is thus effected in two stages. In FIGS. 2(a) to (c), in a first stage, firstly the auxiliary contact 22 is electrically connected to the conductors 12. For this purpose, as is illustrated in FIG. 2(a), preferably a metal lamina wetted with solder agent is placed onto the corresponding location of the textile material 10 and pressed down by the hot tip of the soldering device 20 along the arrow direction in FIG. 2(a).

Figure 2A:
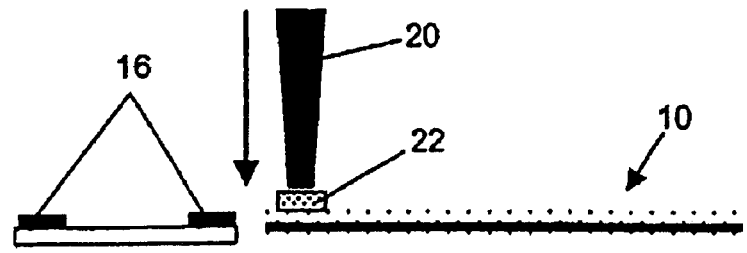
Figure 2B:
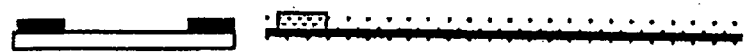
Figure 2C:
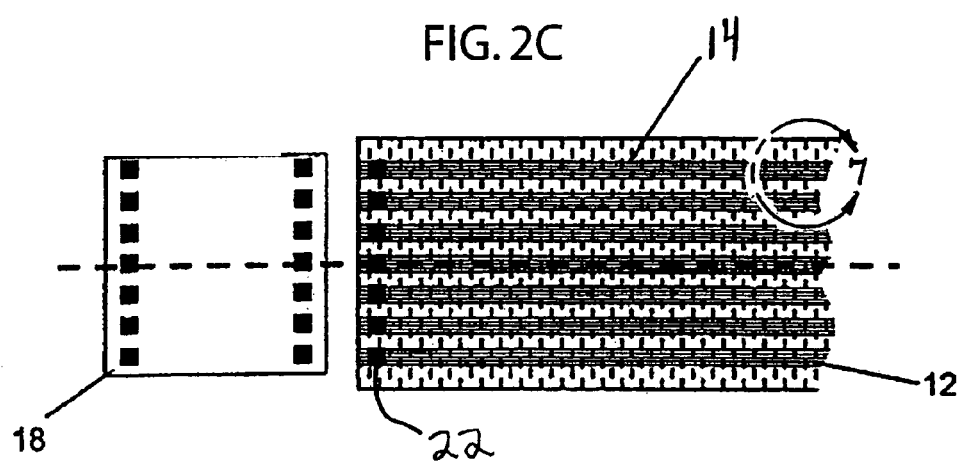

FIG. 2(b) shows the textile material 10 with auxiliary contacts 22 fixed thereto, said auxiliary contact being electrically connected to the corresponding conductor 12. FIG. 2(c) illustrates a plan view of the device in this process stage, the broken line indicating the sectional axis for the sectional view shown in FIG. 2(b). The pressing-down of the auxiliary contact results in the melting of the synthetic fiber fabric of the textile material 10, a possible electrical insulation of the woven-in metal wires in the electrically conductive warp threads 14 and also the solder agent. After cooling, the conductor 12 is conductively connected to the auxiliary contact and the resolidified synthetic fiber provides for a mechanically loadable fixing of the auxiliary contact at the textile material. As a result of this method, the fabric structure is fused together below the auxiliary contact and in a certain adjacent region and constitute a mechanically, thermally and chemically loadable unit.

Figure 2D:
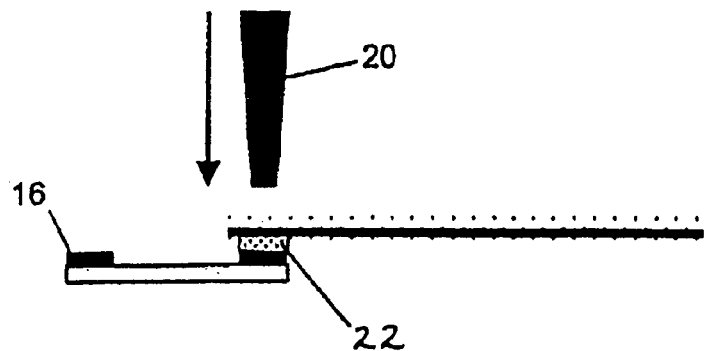

At the textile material 10 prepared in this way with electrically connected auxiliary contacts 22, electrical connections to assigned contact points 16 of the electronic components 18 may be created in a second stage. Two possible arrangement variants are taken into consideration for this purpose. In the first instance, as is shown in FIG. 2(d), the auxiliary contact 22 may be arranged on that side of the textile material 10 which faces the contact point 16. In this case, the electrical connection of the auxiliary contact 22 to the contact point 16 is effected by a mechanical pressing-on and heating step for example by means of a hot tip of a soldering device 20 which is placed onto that side of the textile material 10 which is opposite to auxiliary contact 22. As an alternative, it is possible, as illustrated in FIG. 2(e), to arrange the textile material 10 with fixed auxiliary contact 22 onto the contact point 16 in such a way that (melted and laterally displaced) weft threads of the textile material 10 are arranged between the auxiliary contact 22 and the contact point 16.

Figure 3:
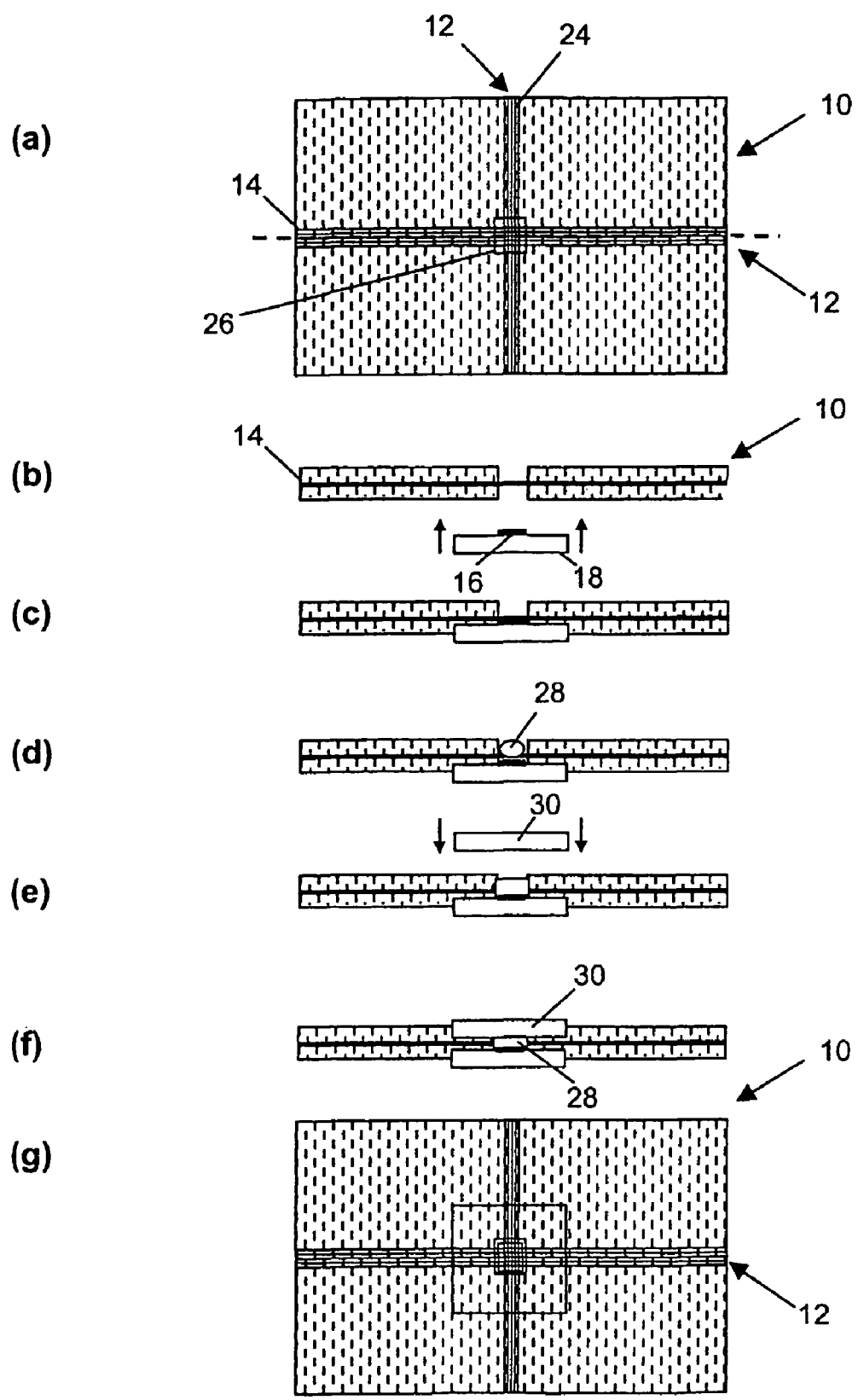
FIGS. 3(a) through 3(g) show diagrammatic views in plan view and section of a further embodiment of the invention, in which two conductors arranged in the textile material are electrically connected to one another.

FIG. 3 illustrates a further embodiment of a device according to the invention. In this embodiment, an electrical connection is produced between a conductor 12 running in the warp direction and a conductor 12 running in the weft direction. The conductor 12 extending in the warp direction is constructed from a multiplicity of electrically conductive warp threads 14 and the conductor 12 extending in the weft direction is constructed from a multiplicity of electrically conducted weft thread threads 24. In the case of this electrical connection method, firstly the non-conductive fibers and also a possibly present insulating sheath of the spun-in metal wires are removed in the crossover zone of the warp and weft threads 14 and 24 by means of a thermal or chemical step. The crossover zone is illustrated by a rectangle designated by the reference symbol 26 in FIG. 3(a).

Afterward, as is illustrated in FIG. 3(b) in section along the broken line of FIG. 3(a), a component 18 with a contact point 16 fitted thereto is brought close to the underside of the textile material 10 in such a way that the electrically conductive point 16 comes into contact with the electrically conductive weft and warp threads 14 and 24 that cross each other. The result is illustrated in FIG. 3(c). In this case, the component 18 is merely an auxiliary device which is intended to ensure the reliable contact between the electrically conductive thread systems of the fabric that cross each other. By way of example, the component 18 is an approximately 100 μm thick plastic film on which a metal pad (in particular an etched copper pad which typically has a thickness of approximately 20 μm and, if appropriate, is additionally coated with a solder agent) is applied centrally. The dimensioning of said plastic film is preferably dimensioned such that its bearing area on the textile material 10 permits reliable adhesive bonding and/or welding to the latter.

As is illustrated in FIG. 3(d), the electrically conductive weft and warp threads 14 and 24 that cross each other in the contract region 26 are subsequently electrically connected to the contact point 16 by means of a conductive adhesive or a solder agent 28. As an alternative, the connection to the contact point 16 may be performed by soldering on an auxiliary contact, in particular a small metal lamina in accordance with FIG. 2. The contact region or crossover point 26 of the electrically conductive thread systems is subsequently electrically insulated preferably by means of a further insulating film 30 placed on from above and welded or by application of an insulating coating. The device in this production stage is illustrated diagrammatically in section in FIG. 3(f) and in plan view in FIG. 3(g).

Figure 4:
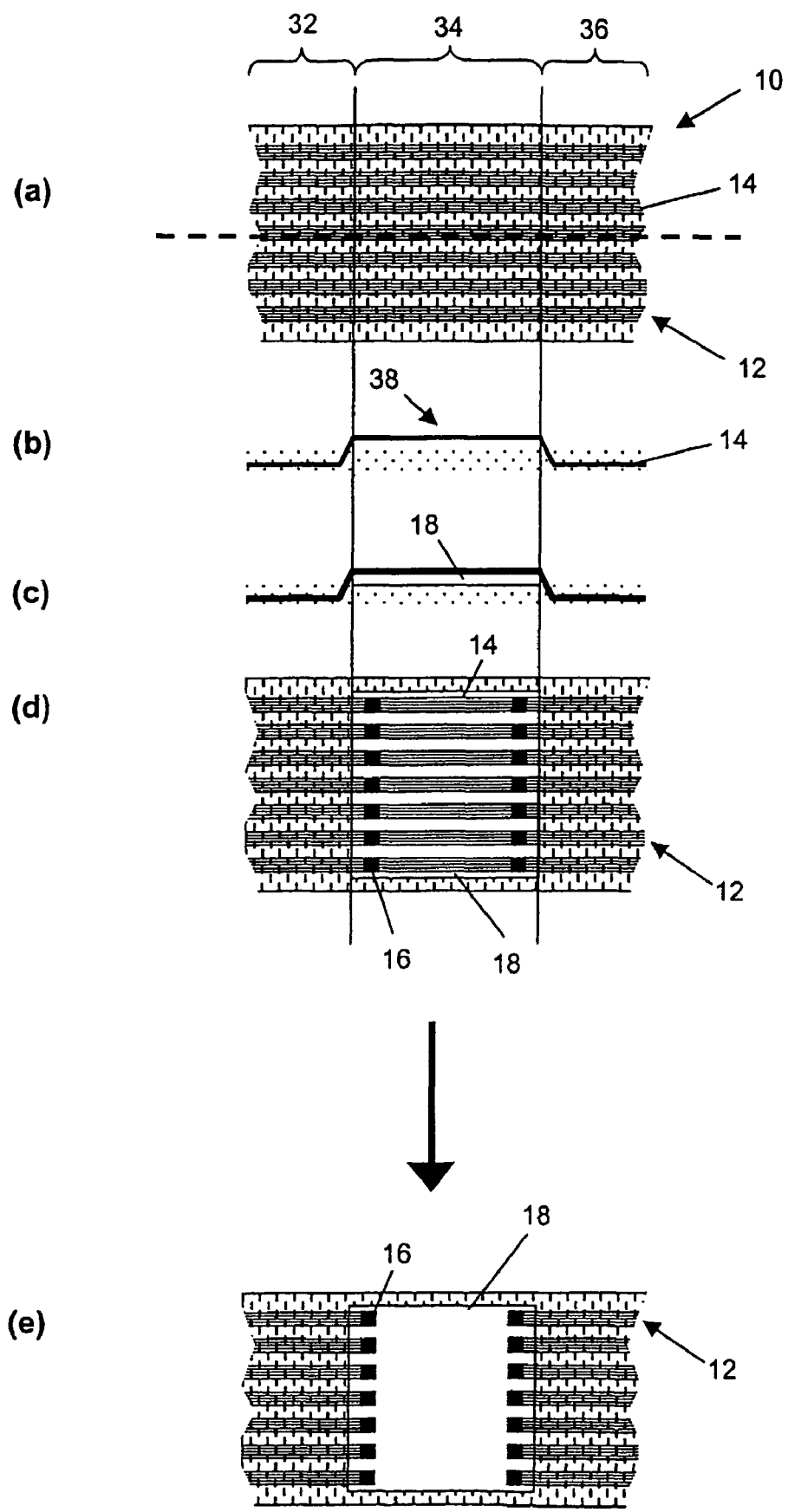
FIGS. 4(a) through 4(e) show diagrammatic views in plan view and section of a further embodiment of the invention, an electronic component being arranged in a component pocket of the textile material.

FIG. 4 illustrates a further embodiment of a device according to the invention. In this embodiment, the electronic component 18 can be held in a component pocket 38 in a self-aligning manner in the textile material 10. For this purpose, as is illustrated in FIG. 4(a), the electrically conductive warp threads 14 are permanently raised during the weaving process in a region 34 of the textile material 10, so that they run loosely above the rest of the fabric structure in this region. In the adjoining regions 32 and 36, the electrically conductive warp threads 14 which form the conductors 12 are woven "normally" into the textile material 10. The raising of the warp threads 14 in the region 34 may be effected for example by means of the Jaquard technique. As a result of this, as is illustrated in FIG. 4(b), a component pocket 38 is formed, into which the components 18 can be pushed (FIG. 4(c)). The component 18 is held in the component pocket 38 in a self-aligning manner since the freely running conductive warp threads 14 preferably run under a certain tensile stress and bear tautly above the module. If the components 18, as is illustrated in FIG. 4(d), has two opposite rows of contact points 16, the warp threads 14 may be removed subsequently (i.e. after contact-connection by means of one of the methods described in association with FIGS. 1 to 3) by means of a suitable cutting tool between the two rows of contact points 16, thereby eliminating the possibly undesirable short circuit. The result of such a cutting process for removing the electrical conductors between the rows of contact points 16 is illustrated in FIG. 4(e). Such a method might be advantageous particularly when a plurality of chips (for example sensor chips) interconnected with a serial interface to form a chain are intended to be introduced along the textile material.

Figure 5:
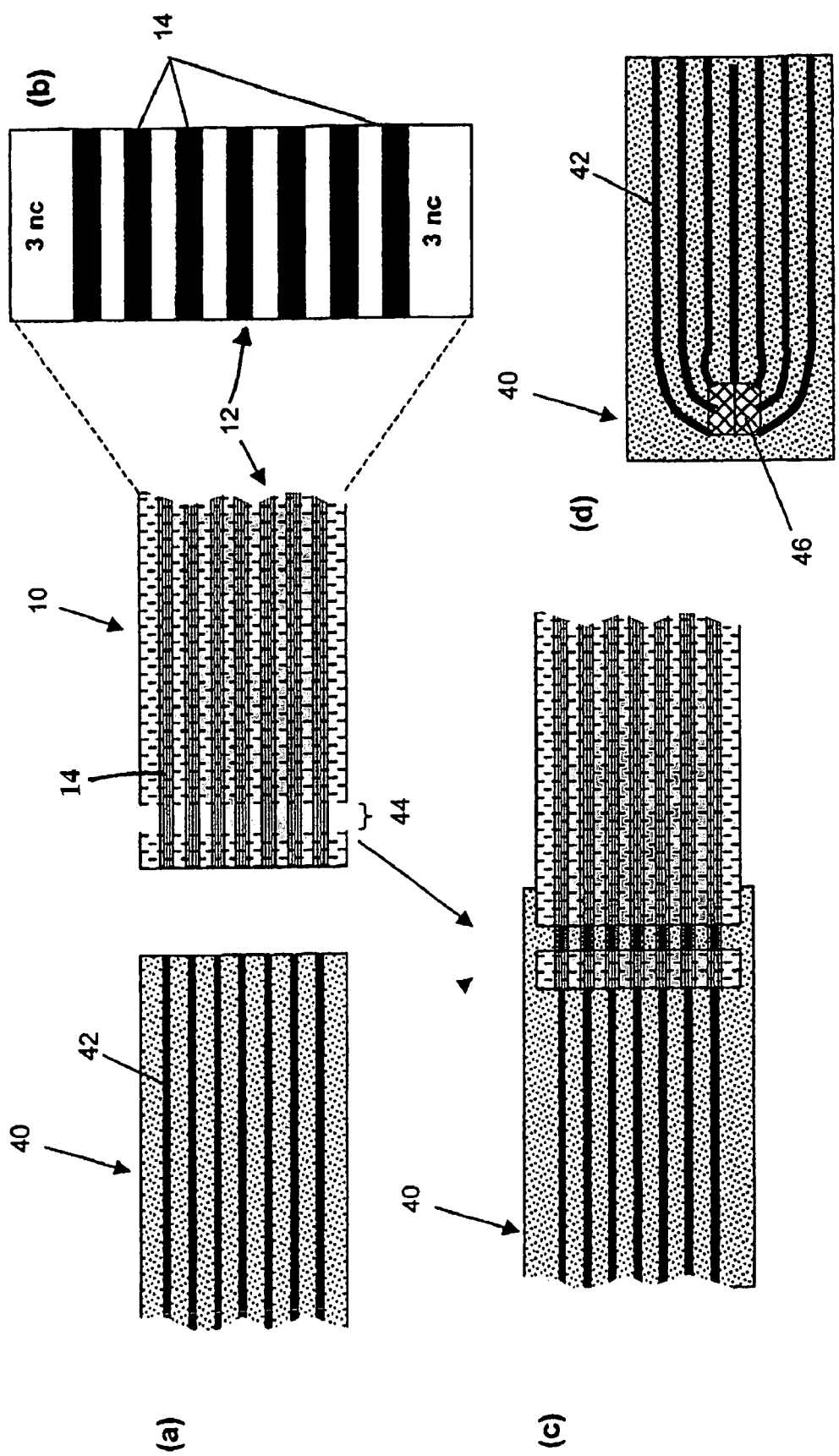
FIGS. 5(a) through 5(d) show diagrammatic plan views of a further embodiment of the invention, a multiplicity of conductors arranges in a textile material being electrically connected to a flexible strip.

FIG. 5 illustrates a further embodiment of a device according to the invention. In this embodiment, as the electronic component, a chip is not connected directly to the conductors 12, but rather via a so-called flexible strip 40, which functions as an adapter piece. The flexible strip 40 is for example a flexible printed circuit board made of a polyester film on which metallic conductor tracks 42, in particular copper tracks, have been applied by means of suitable deposition and etching methods (cf. FIG. 5(a)). Preferably, the basis of the flexible strip 40 and also the synthetic fibers of the textile material 10 comprise a material group that is as similar as possible, so that a fixed mechanical connection is achieved during a fusion or adhesive bonding or an ultrasonic welding process.

The electrical contact-connection of the conductors 12 to the metal tracks 42 of the flexible strip 40 may be carried out analogously to the electrical connection methods described with reference to FIGS. 1 and 2. In this case, the flexible strip 40 corresponds to the electronic component 18 and the conductor tracks 42 correspond to the contact points 16. Optionally, the (non conductive) weft threads may be removed in the region 44, in which the conductor 12 runs above the conductor tracks 42 in order to make the electrically conductive warp threads 14 better accessible and to obtain a better electrical contact.

After the production of the electrical connection between the conductors 12 and the conductor tracks 42, the contact region is preferably electrically insulated in order to afford protection against electrical short circuits and corrosion of the materials. The contact-connected textile material 10 with the fitted flexible strip 40 is illustrated in FIG. 5(c). FIG. 5(d) shows a possible connection variant by means of the flexible strip 40. In this case, an integrated circuit 46 is connected to the conductor tracks 42 of the flexible strip 40. This is advantageous particularly when the contact areas fitted on the integrated circuit 46 are too small for the generally coarser textile grid. Consequently, as an adapter piece, the flexible strip 40 affords the possibility of adapting the distances between the electrical connection points between electronics and textiles. Methods for the electrical contact-connection and fastening of the flexible strip 40 to external electronic components 46 are sufficiently well known. It should be taken into account that the size of and distance between connection pads of integrated circuits are typically of the order of magnitude of 0.1 mm and are thus generally smaller than typical periods of a textile fabric (order of magnitude 1 mm). This holds true particularly when a plurality of weft or warp threads lying next to one another in the fabric are intended to be interconnected per actual conductor 12 for reasons of redundancy. A typical thread density in fine fabrics is approximately 20 threads per centimeter, which approximately corresponds to a period (pitch) of 0.5 mm.

Figure 6:
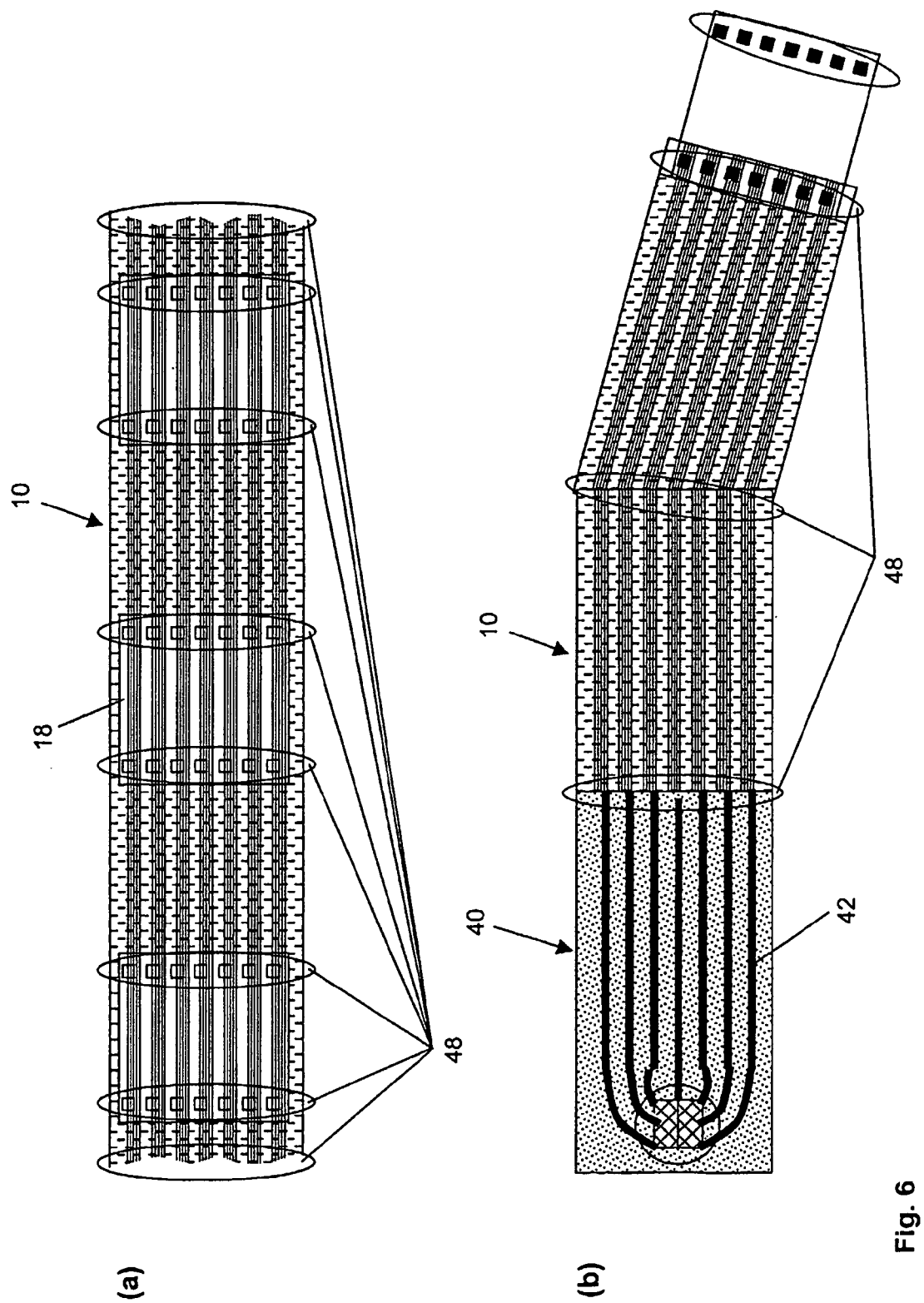
FIGS. 6(a) through 6(b) show a plan view of a further embodiment of the invention with insulating coverings of the contacts created.
Figure 7:
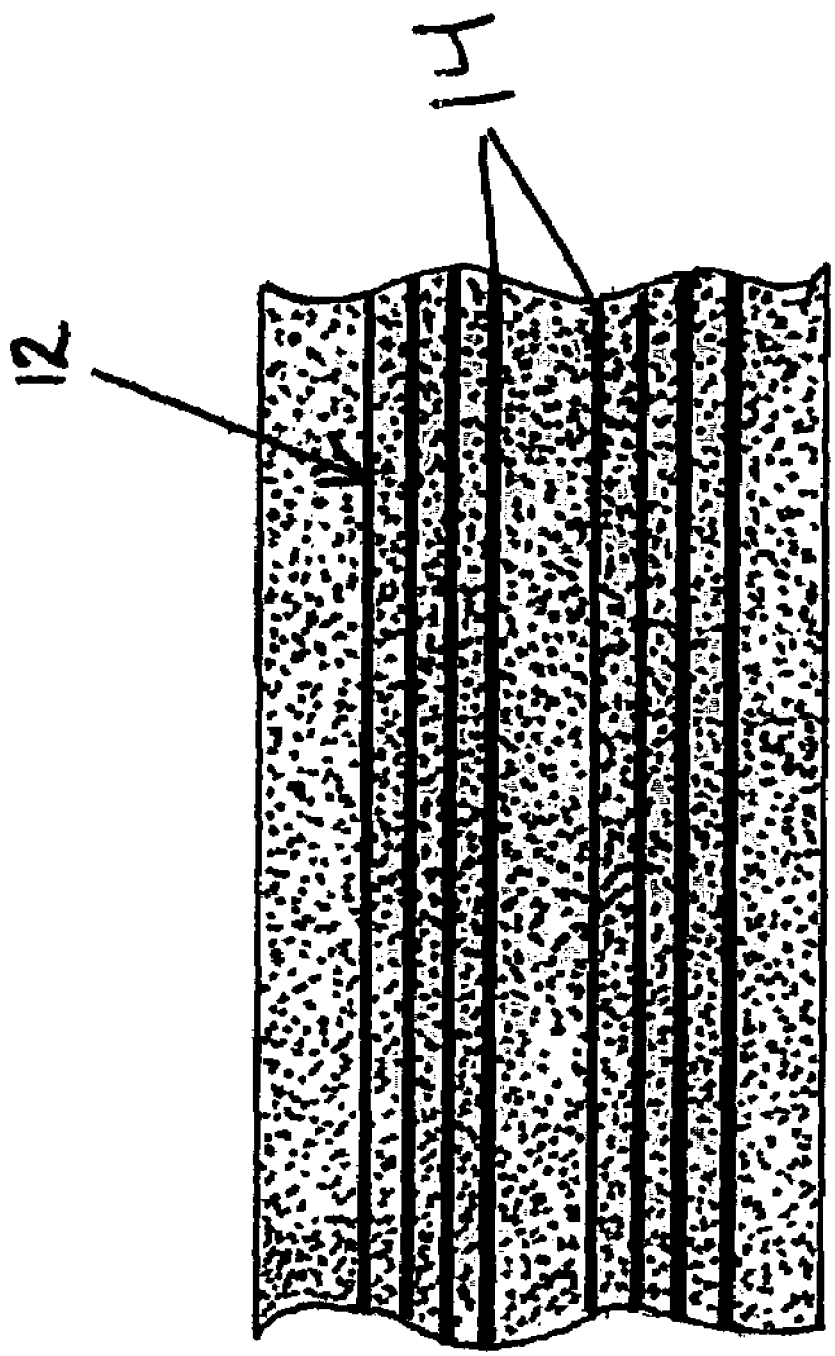
FIG. 7 shows a plan view of a further embodiment of the present invention including an adjustment device.

FIG. 6 shows a further preferred embodiment of a device according to the invention. The mounting of the electronic components 18 in accordance with one of the embodiments described above results in open, non-insulated locations which should advantageously be electrically insulated again in order e.g. to be encapsulated with respect to moisture influences. This is advantageously done by potting the relevant locations, in particular the contact regions of the contact point 16 and the conductors 12, with an encapsulating material suitable for electrical insulation. FIG. 6(a) shows some contact regions which are preferably subjected to an electrically insulating encapsulation. The insulating material 48 may be for example a soft silicone or a flexible thermoplastic film preferably made of a similar material group to the textile fiber which can be placed onto the textile material 10 and be fused with the latter. Such an encapsulation is advantageously also to be fitted at cut edges perpendicular to the course of the electrically conductive fibers 14, in particular at the ends of material webs or at seams. As an alternative, the entire conductor track structure can subsequently be electroplated in particular with insulating polymers, so that all open locations which arise due to soldering points or defects are electrically insulated.

The invention claimed is:

1. A method for electrically connecting an electrical conductor to an electronic component comprising the steps of:
   providing a textile material in which at least one thread-like electrical conductor is arranged;
   positioning the electrical conductor relative to an electrically conductive contact point of the electronic component; and
   electrically connecting the conductor to the contact point comprising the steps of
   providing a metal lamina auxiliary contact to a first side of the textile material;
   applying a solder agent to at least one region of the metal lamina, with the contact point facing a second side of the textile material; and
   mechanically pressing the conductor onto the contact point with a heat wherein the textile material is disposed between the contact point and the auxiliary contact.

2. The method as claimed in claim 1, wherein the conductor is pressed on the contact point using a soldering device.

3. A method for electrically connecting a conductor to an electronic component comprising the steps of:
   providing a textile material including a plurality of non-conductive fibers and a plurality of thread-like electrical conductors arranged therein so as to define a cross-over section where the electrical conductors cross-over one another, the non-conductive fibers being removed in the cross-over section to expose the crossed electrical conductors;
   positioning an electrically conductive contact point of the component onto at least two conductors arranged in the textile material at said cross-over section;
   fixing the component at the textile material; and
   soldering or conductive adhesive bonding the contact point to the conductors.

4. The method as claimed in claim 3, further comprising the steps of:
   positioning an insulating film onto that side of the textile material which is opposite the component for the insulation of the contact point; and
   fixing the insulating film onto the textile material.

5. A device comprising:
   a textile material including a plurality of non-conductive fibers and a plurality of thread-like electrical conductors arranged therein so as to define a cross-over section where the electrical conductors cross-over one another, the non-conductive fibers being removed in the cross-over section to expose the crossed electrical conductors; and
   at least one component having an electrically conductive contact point,
   wherein the conductor is electrically conductively connected to the contact point by placing the electrically conductive contact point in contact with the electrical conductors in the cross-over section.

6. The device of claim 5, wherein the component is an auxiliary device with the contact point being formed on a face thereof which faces the cross-over section.

7. A device comprising:
   a textile material including a plurality of thread-like electrical conductors arranged therein, wherein the thread-like conductors are permanently raised in a first section so as to be continuous and run loosely above adjoining sections of the textile material, the loose conductors in the first section defining a component pocket; and
   at least one electronic component having an electrically conductive contact point,
   wherein the conductor is electrically conductively connected to the contact point by inserting the component into the component pocket with the electrically conductive contact point being placed in contact with the electrical conductors in the first section.

* * * * *